United States Patent [19]
Gesley et al.

[11] Patent Number: 5,412,218
[45] Date of Patent: May 2, 1995

[54] DIFFERENTIAL VIRTUAL GROUND BEAM BLANKER

[75] Inventors: Mark A. Gesley, Oakland; David H. Colby, Fremont, both of Calif.

[73] Assignee: ETEC Systems, Inc., Hayward, Calif.

[21] Appl. No.: 23,983

[22] Filed: Feb. 26, 1993

[51] Int. Cl.⁶ ............... H01J 37/147; H01J 37/09
[52] U.S. Cl. ............... 250/396 R; 250/505.1
[58] Field of Search ............ 250/396 R; 313/361.1

[56] References Cited

U.S. PATENT DOCUMENTS

| | | | |
|---|---|---|---|
| 4,367,411 | 1/1983 | Hanley | 250/492.2 |
| 4,434,371 | 2/1984 | Knauer | 250/396 R |
| 4,445,041 | 4/1984 | Kelly et al. | 250/505.1 |

FOREIGN PATENT DOCUMENTS 0516098  12/1992  European Pat. Off. ...... H01J 37/04

OTHER PUBLICATIONS

Mark Gesley & Pat Condran "Electron Beam Blanker Optics" *J. Vac. Sci Technol. B 8(6),* Nov./Dec. 1990.

M. G. R. Thomson et al. "The EBES4 electron-beam column" *J. Vac Sci. Technol. B,* vol. 5, No. 1, Jan./Feb. 1987.

*Primary Examiner*—Bruce C. Anderson
*Attorney, Agent, or Firm*—Skjerven, Morrill, MacPherson, Franklin & Friel

[57] ABSTRACT

Spurious electrodynamic effects are reduced or eliminated by the use of a mechanically compact, low capacitance, geometrically symmetric, differentially-driven blanker assembly. This eliminates the need for internal cables or SMA-type launchers and has a solid metal electromechanical contact to system ground.

24 Claims, 10 Drawing Sheets

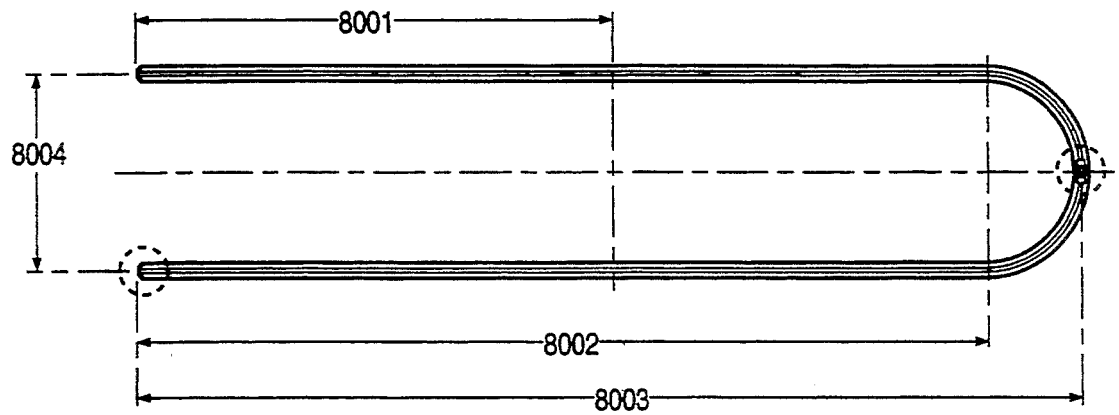
FIG. 8A
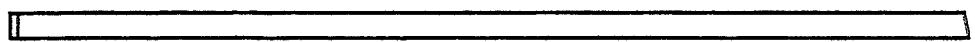
FIG. 8B
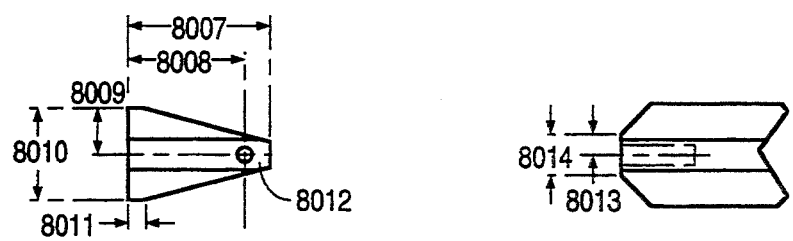
FIG. 8C
FIG. 8D
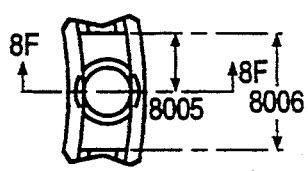
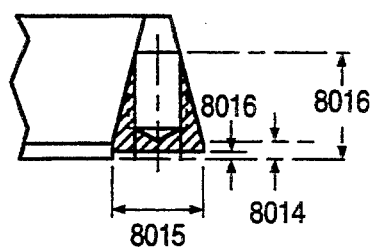
FIG. 8E
FIG. 8F

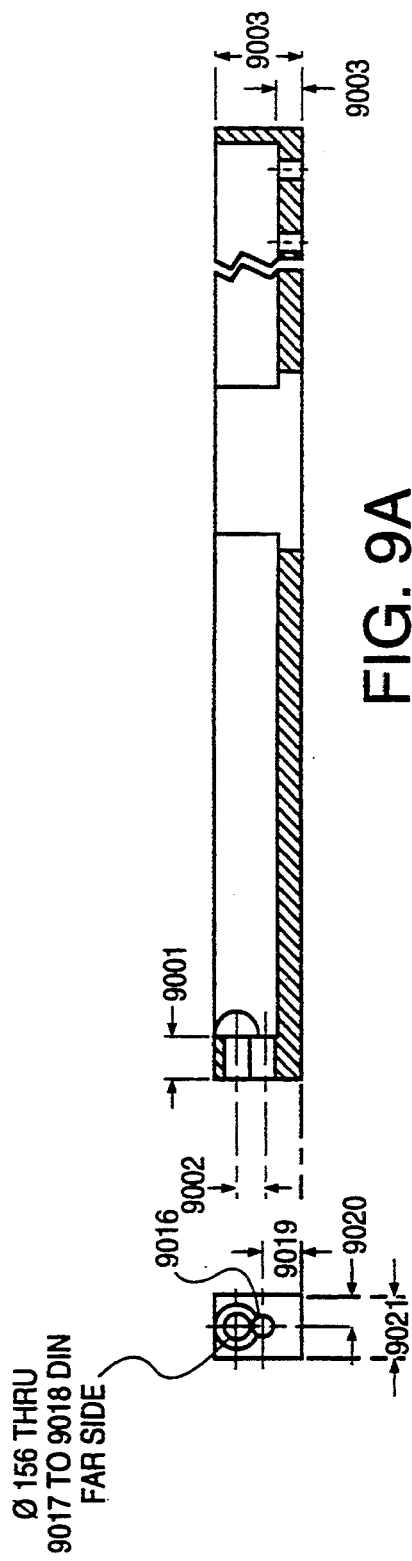
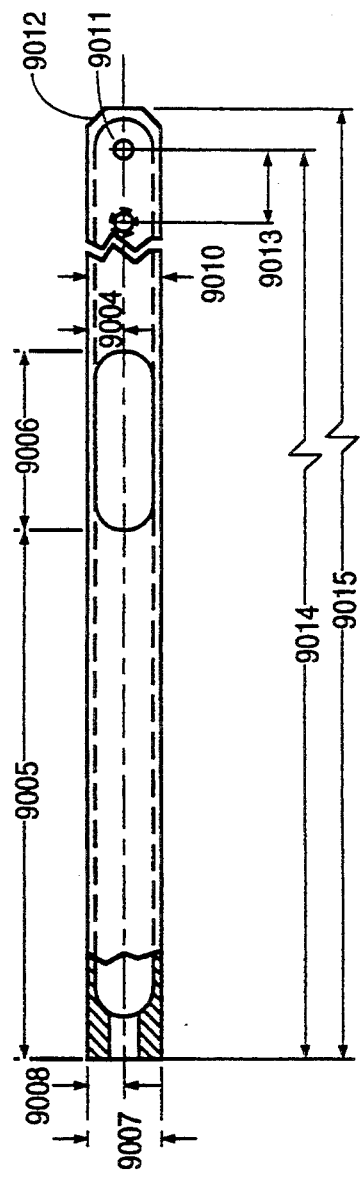
FIG. 9A
FIG. 9B
FIG. 9C

DIFFERENTIAL VIRTUAL GROUND BEAM BLANKER

BACKGROUND OF THE INVENTION

1. Field of the Invention

The present invention relates to an electron beam blanker, and in particular to a differential virtual ground beam blanker.

2. Description of the Related Art

Beam blanking is a required function for all electron beam systems used in lithography, testing, metrology, and inspection. Double deflection beam blankers are well known in the art, and are described, for example, in U.S. Pat. No. 4,445,041 issued Apr. 24, 1984 to Kelly et al. and U.S. Pat. No. 5,276,330 issued on Jan. 4, 1994 (hereinafter Gesley 330). Double deflection beam blankers reduce beam positional jitter at the target due to electric field effects which occur during blanking.

Beam positional jitter is minimized at the target by balancing the interaction of the blanker voltage and the electron transit time through the blanker. The double deflection beam blanker is configured as a matched impedance transmission line to minimize voltage reflections along the line, thereby reducing the electric field effects on the beam. The double deflection beam blanker reduces the beam transit time effect on positional accuracy at the substrate-target by producing a second, delayed impulse to the beam as it passes through the blanker assembly.

However, a number of electrodynamic effects misplace the beam during and after the blanking operation, thereby producing spurious exposures in lithography or inaccurate measurements during inspection. One of these electrodynamic effects is a magnetic field interaction referred to as eddy currents. Typically, a blanker driver current indirectly interacts with the beam and generates a time-dependent magnetic field. This field in turn induces currents in neighboring conductors, such as the blanker housing. Eddy currents in these conductors then produce another magnetic field, commonly referred to as a B-field, which subsequently interacts with the electron beam on a much longer time scale, i.e. having exponential decay behavior. Even though individual pixel exposure times are small for photolithographic applications, e.g. with 160 MHz data rates that have 6.25 nsec pixel dwell times, the induced time-dependent magnetic field generated by the eddy currents can have serious effects over relatively "long" times compared to the blanking transition, i.e. from microseconds to hundreds of milliseconds. Thus, these eddy currents undesirably influence the beam position at the target located below the blanker.

Thus, a need arises for a double-deflection beam blanker that reduces these spurious magnetic field effects, thereby resulting in a blanking system with higher beam positional accuracy.

SUMMARY OF THE INVENTION

In accordance with the present invention, undesirable eddy current effects are eliminated by ensuring antiparallel current flow through the blanker voltage plates. The antiparallel current effectively cancels magnetic fields external to the blanker voltage plates, thereby preventing eddy currents from being generated in neighboring conductors. Elimination of eddy currents significantly increases beam placement accuracy at the mask.

In one embodiment of the present invention, the blanker assembly includes a differential driver. The differential driver eliminates the uncompensated return current flow during the time it would otherwise take for the signal to propagate back along a virtual ground plate in a virtual ground single-driver blanker. The differential driver reduces the magnetic field generated directly by the driver induced current flow, thus diminishing the fast "blip" motion that effects pattern edge acuity and is characteristic of double deflection beam blankers.

In further accordance with this embodiment, a supporting metallic flange assembly provides a solid high frequency ground, thereby eliminating voltage ringing and significantly reducing voltage reflections. A direct connection of the blanker plates to the flange of the blanker assembly eliminates the use of internal cabling sub-miniature assembly (SMA) launchers which reduce voltage reflections caused by unmatched impedances. The absence of the cabling also eliminates a source of permeable material, and hence imperfections which commonly occur in commercially available cables even if stainless steel is used.

In further accordance with the present invention, the use of geometrically symmetric blanking plates provides an efficient magnetic field cancellation when antiparallel currents of equal magnitude are flowing through the blanking plates. Symmetric blanking plates reduce the direct magnetic field effect on fast blip motion, as well as eddy current effects which are proportional to the magnitude of the direct magnetic field.

In another embodiment of the present invention, the absence of a blanker assembly cover reduces stray capacitance and, hence, voltage ringing. Additionally, the absence of a cover reduces the electric field that can be created along the beam axis by voltage ringing by moving the system ground surfaces farther away from the plates.

In another embodiment of the present invention, a smaller axial plate length reduces the blip effect caused by dynamic electric field interaction.

BRIEF DESCRIPTION OF THE DRAWINGS

FIGS. 8A–8F illustrate various views of a blanker voltage plate for operation at 10 kV in accordance with the present invention.

FIGS. 9A to 9C show various views of a channel which supports the blanker voltage plates of the present invention.

DETAILED DESCRIPTION OF THE DRAWINGS

The basic-principles of operation of a double deflection beam blanker and the resulting improvements in accuracy that this blanker provides in contrast to simple parallel plate blankers are described in Gesley 612 which is herein incorporated by reference in its entirety.

Figure 1:
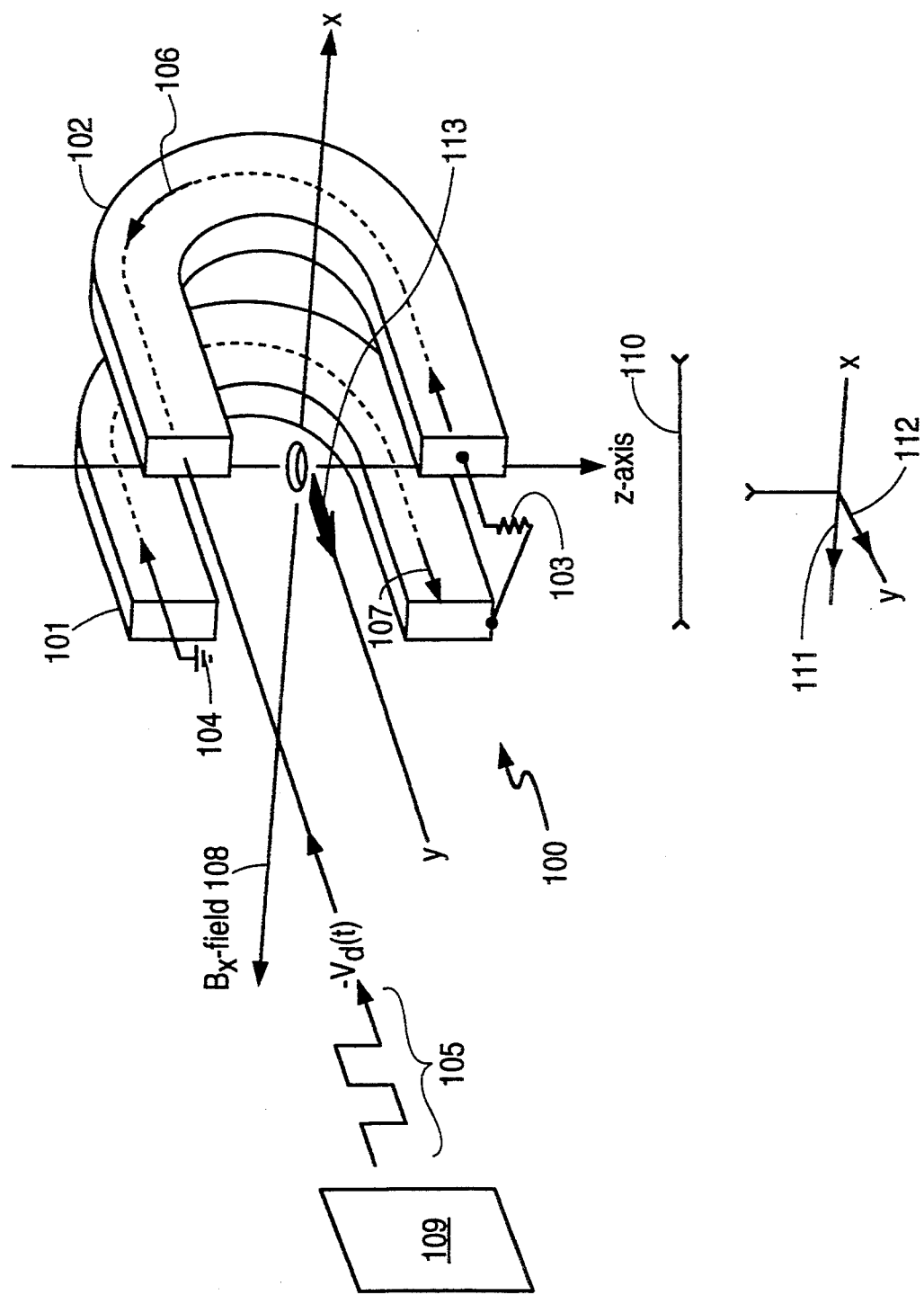
FIG. 1 illustrates a schematic of a virtual ground single-driver double deflection blanker.

In accordance with the present invention, eddy currents are reduced by providing antiparallel current flow in a double deflection beam blanker. Referring to FIG. 1, double deflection beam blanker 100 includes a virtual ground plate 101 and a blanker voltage plate 102. Virtual ground plate 101, which is coupled to voltage reference 104, is effectively at ground potential.

Figure 2A:
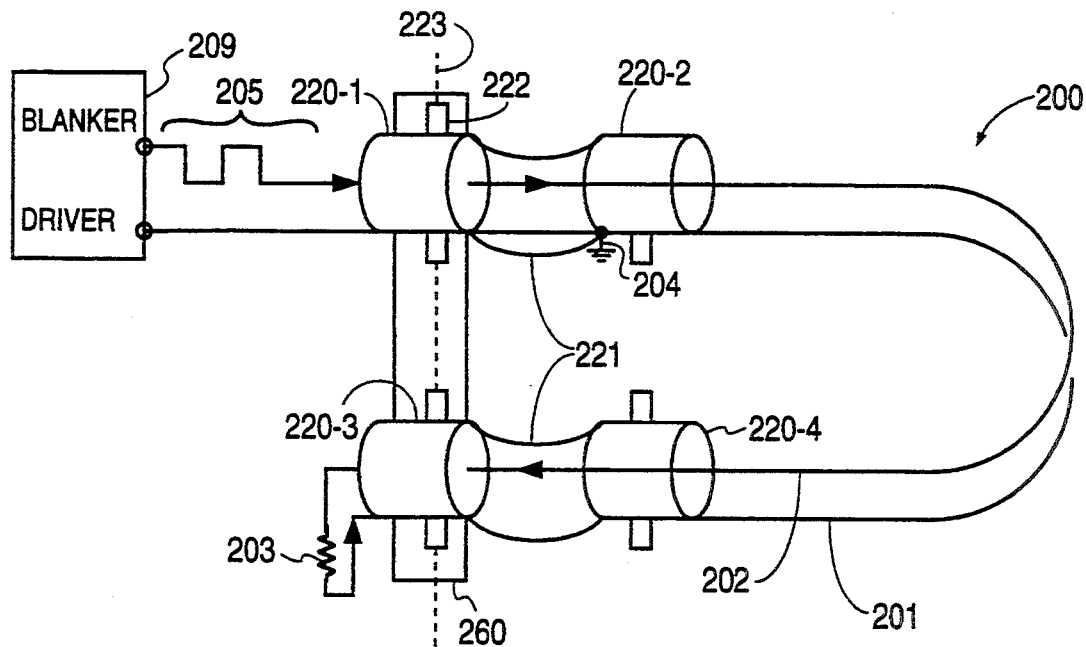
FIG. 2A shows an electrical circuit representation of a virtual ground single driver double deflection blanker.

A voltage driver 109 provides a negative voltage signal 105 to blanker voltage plate 102, thereby creating a positive current flow through blanker voltage plate 102 in a direction indicated by arrow 106. Arrow 113 represents a beam perturbation from eddy current δy-motion at the blanker. Final lens 110 causes 90° beam rotation and demagnifies δy-motion 0.3 times at the mask plane. Arrow 111 represents a reduced beam perturbation from eddy current δx-motion at the mask, while arrow 112 represents beam motion due to blanker electrostatic deflection. The energy of voltage signal 105 is dissipated by the terminating resistor 103. Terminating resistor 103 has a resistance to match the blanker driver power capabilities and requirements for deflection sensitivity. Typically, terminating resistor 103 has a value of 50Ω, an industry-accepted value which is used in many electrical components and devices. Because virtual ground plate 101 is grounded via voltage reference 104, current flowing through terminating resistor 103 is forced to return along virtual ground plate 101 in a direction indicated by arrow 107. The current flow directions in blanker voltage plate 102 and virtual ground plate 101 oppose one another, i.e. flow in antiparallel directions. This antiparallel current flow cancels out the resultant on-axis magnetic field 108 and magnetic fields generated outside the blanker assembly. Thus, eddy currents cannot be generated in neighboring conductors, thereby improving the beam placement accuracy at the target. FIG. 2A shows an electrical circuit representation of the double deflection beam blanker 100 shown in FIG. 1.

Figure 2B:
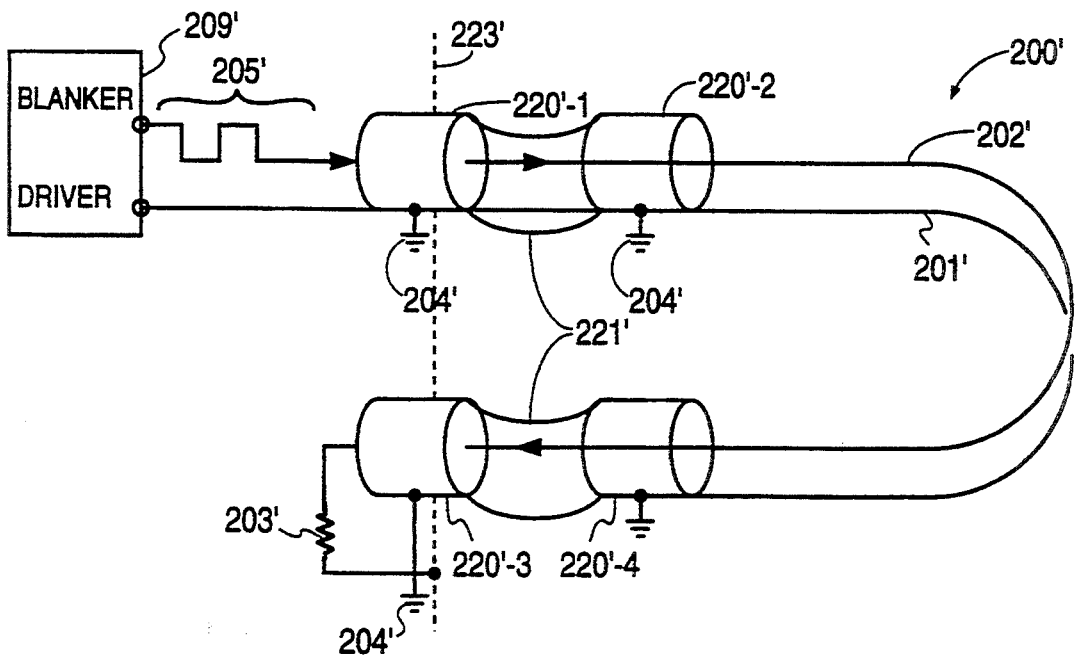
FIG. 2B shows an electrical circuit representation of the double deflection blanker disclosed in Gesley 612.

In contrast, FIG. 2B shows the double defection beam blanker disclosed by Gesley 330 which includes SMA-coaxial connectors 220'-1 and 220'-3 whose coaxial shields are grounded to column 223', semirigid coaxial cables 221', launchers 220'-2 and 220'-4 whose coaxial shield are grounded to column 223', blanker voltage plate 202', a 50Ω termination resistor 203' and grounded blanking plate 201'. Blanker 200' fails to compensate for the eddy currents with a return current. Specifically, as shown in FIG. 2B, the current flows through blanker voltage plate 202' directly to ground 204'. In this configuration, the magnetic field, produced by a current flow through only one of the conductors, i.e. blanker voltage plate 202', generates eddy currents because there is no means to cancel the magnetic field associated with the current flow on and in blanker plate 202'. These eddy currents subsequently produce the time-dependent magnetic field that interacts with the electron beam (not shown).

However, the embodiment of the present invention shown in FIGS. 1 and 2A (hereinafter the single-driver virtual ground blanker or VG-S blanker) similar to the double deflection beam blanker in FIG. 2B, includes SMA-coaxial connectors 220-1 and 220-3 whose coaxial shields are isolated from column wall 223 via insulator 222, semirigid coaxial cables 221, launchers 220-2 and 220-4 whose coaxial shields are isolated from column wall 223 with an internal ground braid 204 connecting the shields to ground, blanker voltage plate 202, a 50Ω termination resistor 203 and virtual ground plate 201. Blanker 200 fails to fully compensate for beam positional inaccuracies due to other electro-magnetic effects described in detail below. Specifically, the current flow in the VG-S blanker only reaches a fully balanced state, i.e. becomes equal in magnitude and antiparallel in direction throughout plates 101 and 102, after the electromagnetic energy enters blanker voltage plate 102, travels along the U-shaped path of plate 102, passes through the 50Ω terminating resistor 103, passes into and through the virtual ground blanker plate 101 and then along a ground path (not shown) to blanker driver 109. For example, if signal 105 propagates at the speed of light, the blanker geometry provides that the above-described time delay interval is approximately 1.6 nsec for the assembly shown in FIG. 6 (described in detail below). This time delay interval corresponds to 25% of one pixel exposure for a electron beam lithography system operating at 160 MHz. Thus, during the initial stages of current generation through the blanker, some positional inaccuracies of the electron beam occur.

Figure 3:
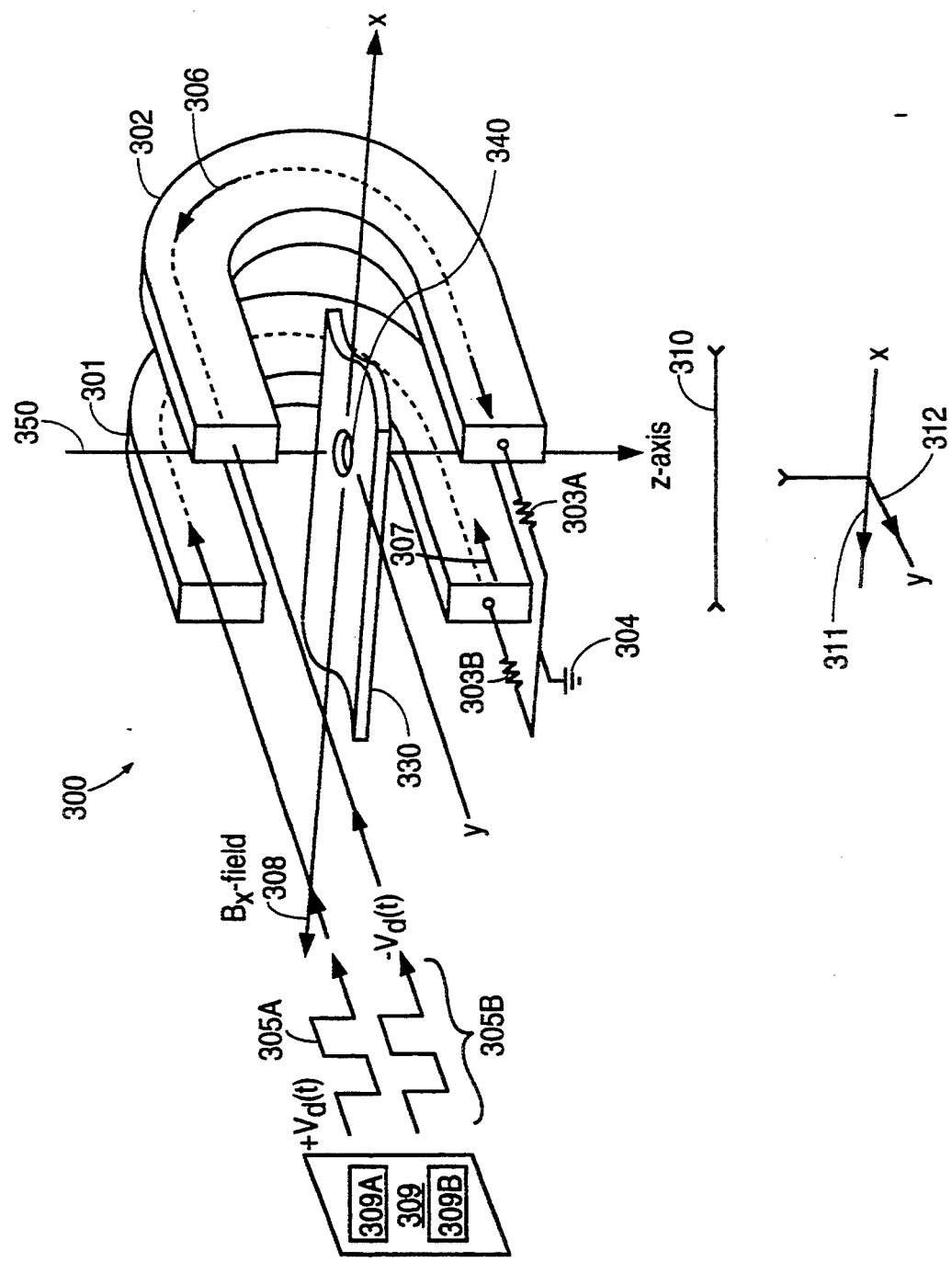
FIG. 3 illustrates a schematic of a differential, virtual ground double deflection blanker in accordance with the present invention.

Therefore, in accordance with another embodiment of the present invention shown in FIG. 3, the double deflection beam blanker 300 includes a differential blanker driver 309. In FIG. 3, similar reference numerals are given to similar elements as in FIG. 1. Downstream of the blanker 300 is a final lens 310 which causes 90° beam rotation and demagnifies δ-motion 0.3 times at mask plane. Similar to FIG. 1, arrow 311 represents a reduced beam perturbation from eddy current δx-motion at the mask, while arrow 312 represents beam motion due to blanker electrostatic deflection. Blanker 300 provides a 100Ω matched impedance line between plate 301 and plate 302 because amplifier chains 309A and 309B each provide a 50Ω resistance output to ground, i.e. have an associated load 303A, 303B to ground 304. A plane of zero potential energy that coincides with the beam axis 350 bisects beam blanker 300. This plane corresponds to an imaginary "virtual ground" (in contrast to the physical virtual ground plate 101 shown in FIG. 1). These impedance line features and the blanker plate symmetry that leads to magnetic field cancellation are collectively termed a "virtual ground" configuration.

Blanker 300 supports differentially driven voltages, i.e. one of the plates is driven to a negative voltage $V_d$ while the other plate is driven to a positive voltage $V_d$ with respect to a voltage reference 304 (ground). Specifically, differential blanker driver 309 provides the signals 305 ($-V_d(t)$) and 305A ($+V_d(t)$) to blanker voltage plates 302 and 301, respectively. In this embodiment of the virtual ground blanker, simultaneous antiparallel current flow is ensured, thereby eliminating the undesirable eddy currents and reducing a fast electrodynamic interaction, termed blip effect, to be described below.

Referring back to FIG. 1, during the time delay of the return current through virtual ground plate 101, an unbalanced magnetic field is created in the driven line, i.e. the line transferring signals 105. This unbalanced magnetic field directly interacts with the electron beam (not shown) and effectively increases a fast "blip" motion. The blip motion is a high speed effect characteristic of double deflection beam blankers occurring at the same time interval as the rise time of the blanker driver voltage, which is on the order of one to two nanoseconds for a high speed blanker operating at a 160 MHz data rate. This blip effect, which occurs even in the absence of eddy currents, has a faster effect on the electron beam than that produced by eddy currents.

Figure 4:
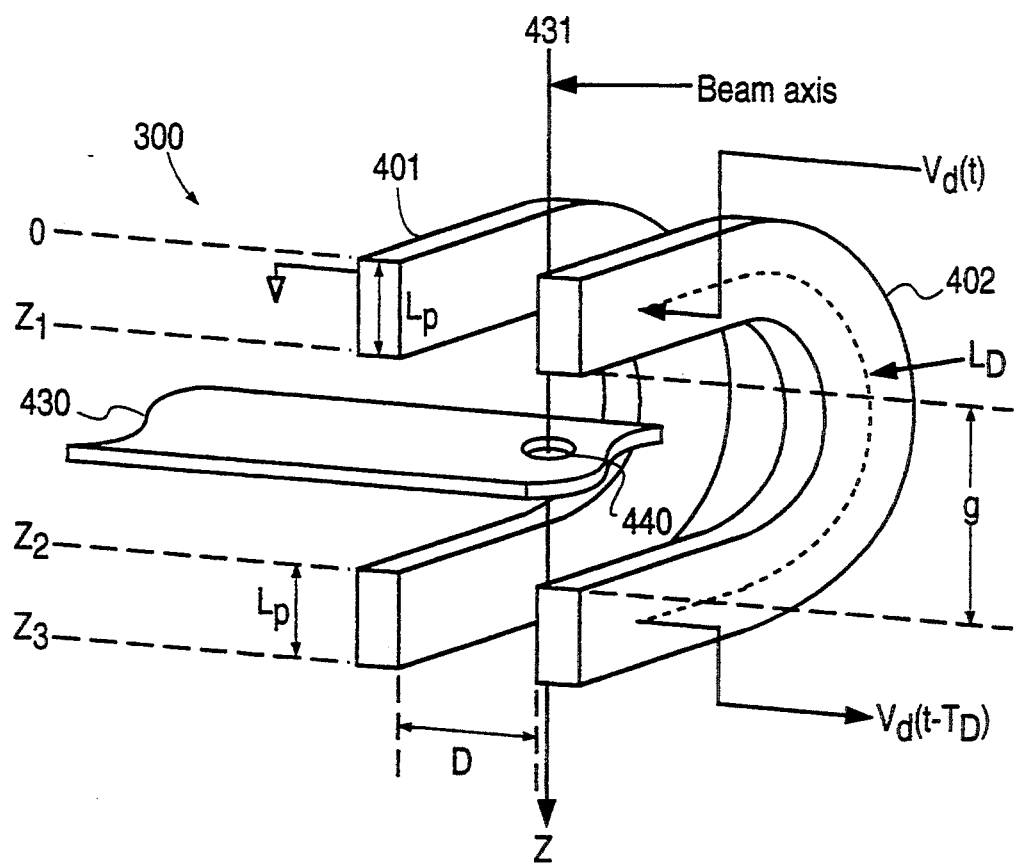
FIG. 4 shows a schematic of a typical double deflection blanker having a plate separation D and a plate length $L_p$.
Figure 5A:
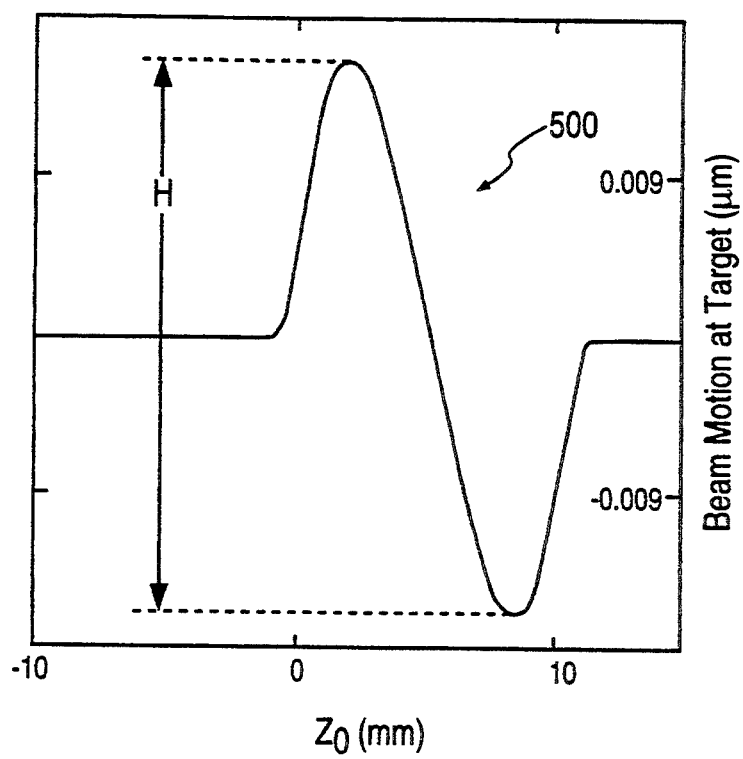
FIG. 5A illustrates a graphical representation of a blip which occurs during double deflection blanking.

The blip motion has two components related to the dynamic electric and magnetic fields generated during the blanker voltage transitions. The blip motion resulting from the magnetic component has a direct relation to the blanker drive voltage and current. Thus, the magnetic component of the blip motion is effectively reduced by using a smaller blanker aperture 440 (FIG. 4) in beam stop 430, or moving the electron beam 431 near the aperture edge of beam stop 430 which serves as a beam stop, thereby reducing the driven voltage requirement for off-axis blanking distance. The blip motion induced by a time-dependent electric field is described in further detail by Gesley and Condran, in *J. Vac. Sci. Technol.* B8 (6), Nov/Dec (1990) and Gesley 330. FIG. 5A, which graphically plots beam motion at the target (ordinate axis) versus electron drift length $z_d$ (abscissa axis) solely due to the electric field component, shows an illustrative blip 500.

Figure 5B:
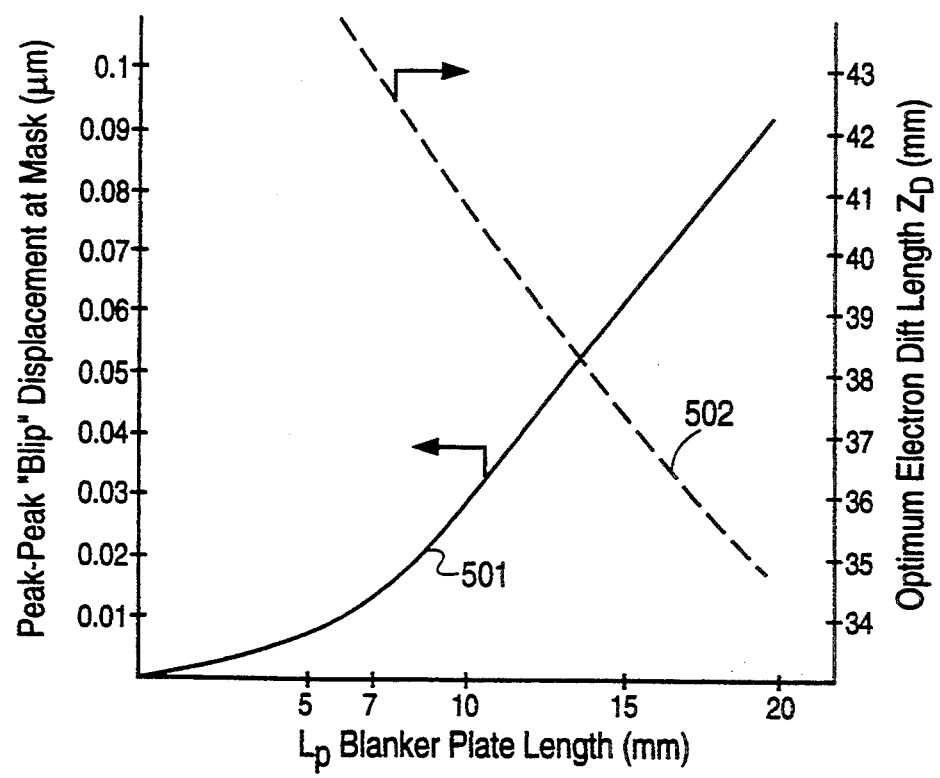
FIG. 5B graphically the relationship between peak-to-peak blip height H and plate length $L_p$ for a lens magnification of M=0.3.
Figure 6:
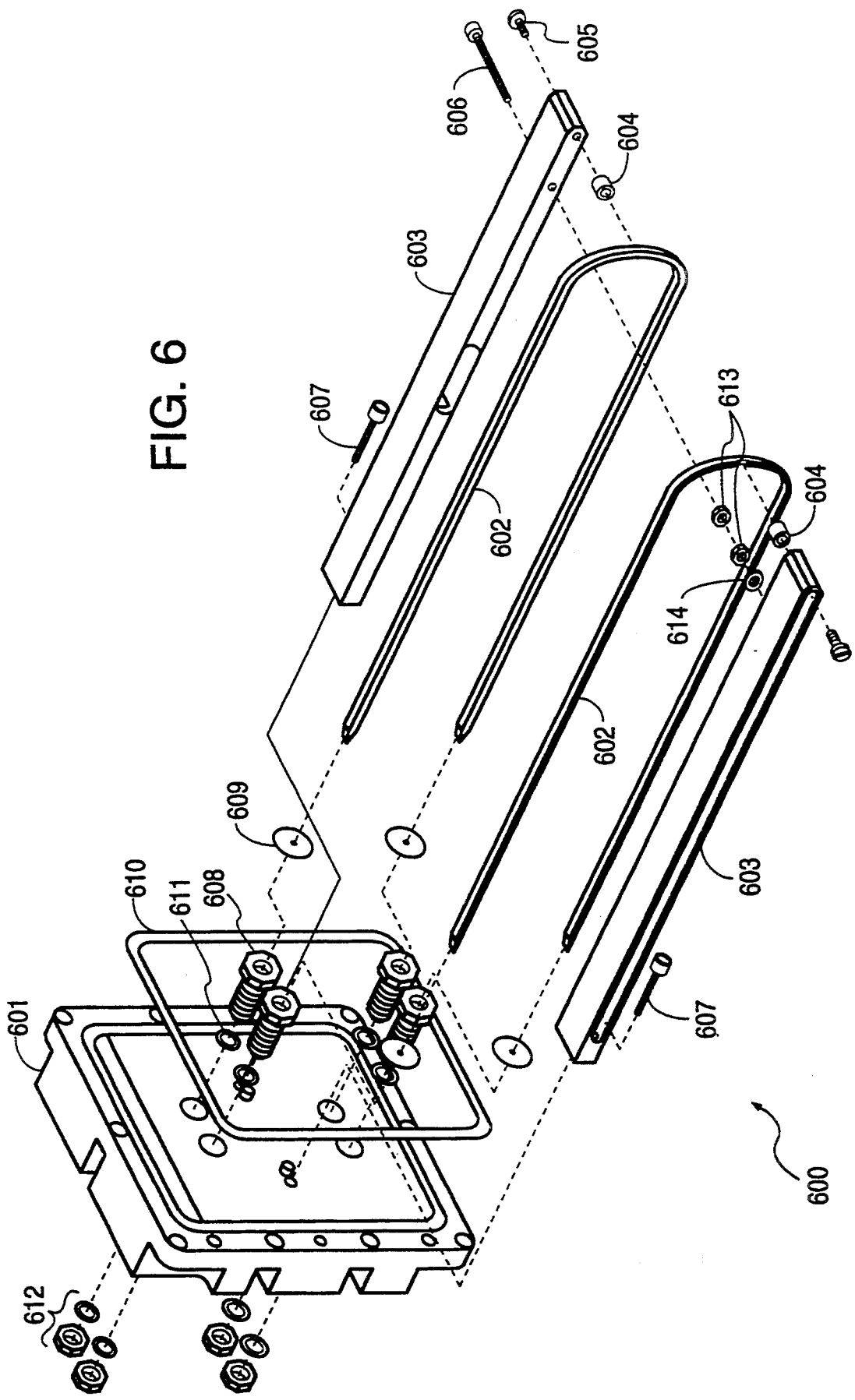
FIG. 6 shows an exploded view of a double deflection beam blanker assembly in accordance with the present invention.

The use of differential driver 309 (FIG. 3) to produce the simultaneous antiparallel current flow decreases the magnitude of blip 500 (FIG. 5). Referring to FIG. 4, the electric field component of the blip is further reduced by decreasing the plate length $L_p$ of blanker voltage plates 401 and 402 over which the field acts on the electron beam 431. As shown in FIG. 5B, as plate length $L_p$ is reduced, the peak-to-peak blip displacement of the residual beam motion is also reduced (waveform 501). However, a lower limit of plate length $L_p$ is defined by two factors. The principal limiting factor that to maintain a matched impedance line, the ratio $L_p/D$ must be kept fixed (where D is the interplate spacing shown in FIG. 4). Thus, if plate length $L_p$ is reduced to minimize blip height, then interplate spacing D must also be reduced. However, interplate spacing D has a practical lower limit, which is application and electron-optically specific. Typically, interplate spacing is set by the of the aperture 340 diameter of the beam stop 330, the beam angle, and positional tolerance that must be provided for within the blanker structure. For example, the interplate spacing D cannot be less than that distance subtended by the beam angle at the beam stop 430 (FIG. 4), otherwise the blanker plates 401 and 402 would interfere with the electron beam 431. Likewise, the interplate spacing D cannot be less than the aperture diameter of electron beam stop 430, otherwise blanker plates 401 and 402 would interfere with electron beam 431 during blanking. The secondary limit on reducing interplate spacing D is the practical problem of spacing the SMA connectors 608 (FIG. 6) to ensure no physical contact with one another during assembly. FIG. 6 shows the minimum spatial orientation without creating mutual interference between SMA connectors 608.

Connectors 608 serve two functions. One function is ensuring there is a matched impedance for that section of the structure, which in this case is 50Ω. Another function is ensuring a vacuum boundary is maintained when flange 601 is assembled with the o-rings 611. The fabrication of these components is non-trivial. Note that in this embodiment of the present invention, commercially available parts are used (described in detail in reference to FIG. 6).

For example, if the assembly shown in FIG. 6 is used with a 10 kV beam voltage, the dimensions for the plate length and interplate spacing are $L_p$=3.38 mm and D=2.134 mm. As shown by the waveform 502 in FIG. 5B, the electron drift length $Z_D$, and hence the optimum delay line length $L_D$ (as shown in FIG. 4) must also be considered when the optimized plate length $L_p$ is determined. This optimization uses the same process described in Gesley 612 for the double deflection beam blanker shown in FIG. 6. For the embodiment of the present invention shown in FIG. 6, the electron drift length $Z_D$=46.84 mm.

In accordance with the present invention, the blanker flange mechanical assembly also aids in maintaining a matched impedance line and significantly reduces an undesirable voltage reflections. Specifically, and referring to FIG. 6, blanker flange 601 is fabricated entirely of a metallic conductor that provides a solid electrical contact to system ground (see 304 in FIG. 3) as well as a vacuum boundary for the column (see 223 in FIG. 2A). In contrast, VG-S blanker 200 (FIG. 2A) includes SMA-coaxial connectors 220 which are electrically isolated from column 223, which acts as system ground. Thus, VG-S blanker 200 requires an internal ground braid (metallic conductor) 204 to reduce capacitance and inductance, thereby in turn reducing associated driver voltage high frequency ringing. Insulators 222 are added to ensure antiparallel current flow in VG-S blanker 200. Referring back to FIG. 6, blanker flange 601 in combination with the adjustable delay line spacers 604 and related parts 604, 605, and 606 permits calibration of the delay line spacing (i.e. the spacing between blanker plates 602) which compensates for small amounts of warpage, distortion, or non-flatness of blanker plates 602 after assembly that are detectable when measuring the voltage reflection coefficient by time domain reflectometry. Specifically, the embodiment shown in FIG. 6 provides a five-fold reduction in the reflection coefficient as measured by TDR (time domain reflectometry) if compared with the apparatus of Gesley 612.

The solid mechanical grounding of blanker plates 602 into blanker flange 601 also significantly beneficially reduces voltage ringing, which is a common problem when driving a load at high frequency. Two sources of voltage ringing are typical. One source of voltage ringing is related to lumped capacitance and grounding that loads the blanker driver in a manner which leads to oscillations. The other source of voltage ringing is related to distributed capacitance that manifests itself through unwanted reflections as the driver voltage propagates along the matched impedance line. Referring back to FIG. 2A, VG-S blanker 200 provides that SMA-coaxial connectors 220-1 and 220-3 on flange 260 are isolated via insulators 222 from ground, i.e column wall 223. To reduce voltage ringing, VG-S blanker 200 brings the ground point (i.e. voltage source 204) internal to the blanker structure itself to reduce capacitance and inductance and hence high frequency ringing. The embodiment of the present invention, shown in FIG. 3, reduces the voltage ringing by altering the path to system ground, i.e. by eliminating the requirement for return current flow to the blanker driver through insulators 222 (FIG. 2A).

Besides improving the signal integrity as it passes through the flange assembly, details of the blanker voltage plate as shown in FIGS. 8A to 8F and the overall flatness tolerances lead to improvements in signal propagation when the parts are assembled by achieving a tighter tolerance on interplate spacing.

Efficiency of B-field cancellation is further enhanced by providing symmetric, U-shaped blanker plates 301 and 302. The symmetry of the these blanker plates provides a substantial reduction of the magnetic field generated directly by the currents flowing in antiparallel directions through blanker 300. The smaller magnetic field reduces both the direct field interaction with the beam, as well as the eddy current-induced magnetic field. direct B-field interaction is so named due to the interaction on the beam by the magnetic field generated directly from the current flow produced in the blanker by the driver electronics. Thus the term direct field refers to the fast electric and magnetic fields generated directly from the current produced by the blanker driver as voltage is applied to the plates and across the terminating resistor.

Blanker 300 also significantly decreases capacitance in contrast to that of Gesley 612 by eliminating the housing for the blanker assembly that exists with Gesley 612. Capacitance is further reduced via the symmetric placement of blanker plates 301 and 302. This lowered capacitance along with solid electromechanical grounding reduces the amplitude and time constant of spurious voltage ringing that is frequently introduced by high frequency operation. The absence of the cover reduces any residual ringing effect by lowering the associated electric field in the vicinity of the electron beam.

Because voltage blanker plates 602 are directly coupled to flange 601 via connectors 608, double deflection beam blanker assembly 600 (FIG. 6) eliminates the need for internal cables, which frequently contain magnetic impurities, and launchers used in the Gesley 612 blanker (see coaxial cable 221' and launchers 220-2 and 220-4). Removal of these components further reduces voltage reflections that degrade the blanker voltage signal.

FIGS. 7A to 7H, 8A to 8F and 9A to 9C illustrate various views of a blanker flange, blanker voltage plate, and channel, respectively, for one embodiment of the present invention which is optimized for 10 kV operation.

Figure 7C:
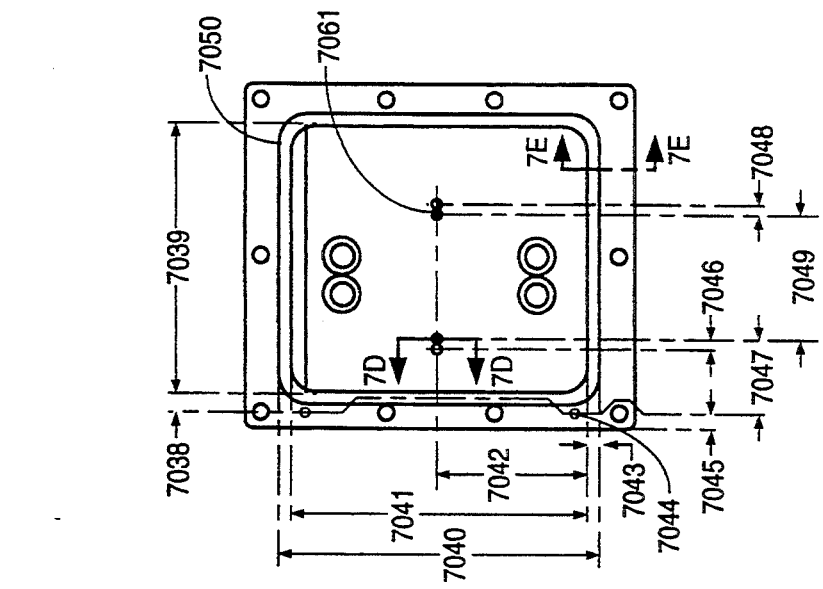
FIGS. 7A–7H show various views of a blanker flange for operation at 10 kV in accordance with the present invention.
Figure 7B:
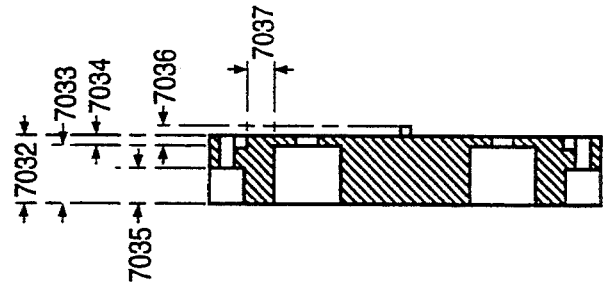
Figure 7A:
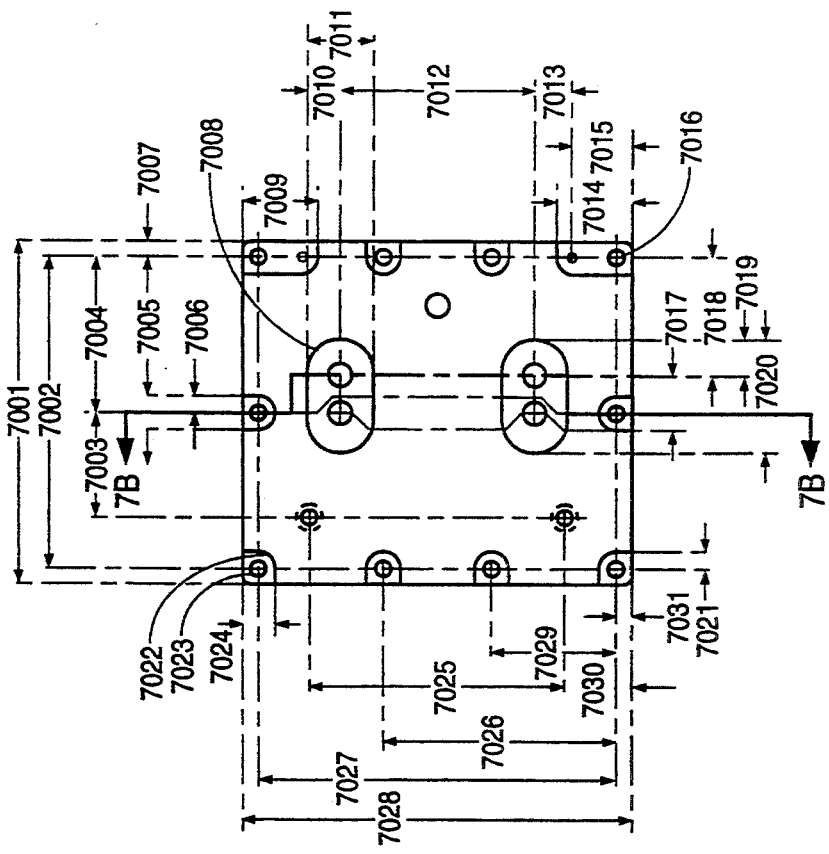
Figure 7D:
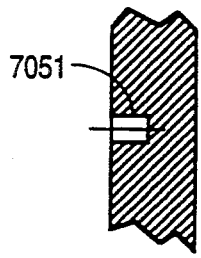
Figure 7E:
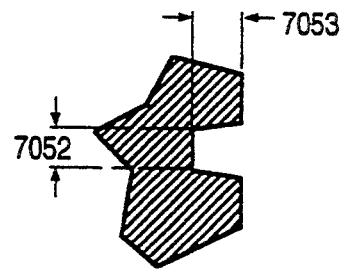
Figure 7F:
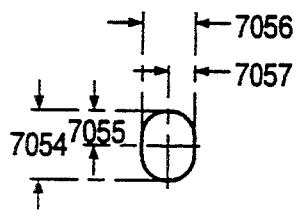
Figure 7G:
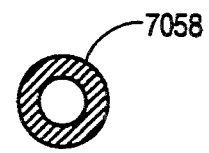
Figure 7H:
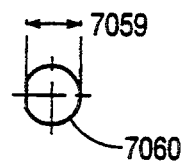

FIG. 7A is a view of the blanker flange; FIG. 7B is a cross section along line 7B—7B of FIG. 7A; FIG. 7C is a back view of the blanker flange; FIG. 7D is a cross section along line 7D—7D of FIG. 7C; FIG. 7E is a cross section along line 7E—7E of FIG. 7C; FIG. 7F is a detail view of the hole at the upper left of FIG. 7C; FIG. 7G is a detail view of one of the large holes in FIG. 7C; and Figure 7H is a detail view of one of the holes in the central part of FIG. 7A.

FIG. 8A is a view of the blanker voltage plate; FIG. 8B is a side view of same; FIGS. 8C and 8D are detail views of the ends of the blanker voltage plate; FIG. 8E is a detail view of the midpoint of the curved portion of the blanker voltage plate; and FIG. 8F is a cross section along line 8F—8F of FIG. 8E.

FIG. 9A is a view of the channel; FIG. 9B is a side view of same; and FIG. 9C is an end view of same.

Dimensions and part numbers are listed for these components in Table I which immediately proceeds the claims. The part numbers included in Table 1 refer to parts available through Etec Systems, Inc. which has a principal place of business at 26460 Corporate Ave., Hayward, Calif. 94545. In one of the present invention, channel support 603 and blanker flange 601 are fabricated from aluminum 6061-T6 with a 32 finish. In this embodiment, blanker voltage plates 602 are fabricated from Oxygen Free High Conductive Copper (OFHC).

In summary, a differential virtual ground beam blanker in accordance with the present invention provides fast, accurate switching of the electron beam by introducing the following features.

1) Antiparallel Current

Eddy current effects are eliminated by ensuring antiparallel current flow through the blanker voltage plates. The antiparallel current effectively cancels magnetic fields external to the blanker voltage plates, thereby preventing eddy currents from being generated in neighboring conductors. Elimination of eddy currents significantly increases beam placement accuracy at the mask.

2) Differential Driver

A differential driver eliminates the uncompensated return current flow during the time it would otherwise take for the signal to propagate back along the virtual ground plate in the VG-S blanker. The differential driver reduces the magnetic field generated directly by the driver induced current flow, thus diminishing the fast "blip" motion that effects pattern edge acuity.

3) Metal Flange Assembly

Using a metallic flange assembly provides a solid high frequency ground, thereby eliminating voltage ringing and greatly reducing voltage reflections.

4) Direct Connection of Blanker Plates to Flange

A direct connection of the blanker plates to the flange eliminates the use of internal cabling and SMA launchers which reduce voltage reflections caused by unmatched impedances. The absence of the cabling also eliminates a source of permeable material, which commonly occurs in commercially available cables, even if stainless steel is used.

5) Symmetric Blanking Plates

The use of geometrically symmetric blanking plates provides an efficient magnetic field cancellation when antiparallel currents of equal magnitude are flowing through the blanking plates. Symmetric blanking plates reduce the direct magnetic field effect on fast blip motion, as well as eddy current effects which are proportional to the magnitude of the direct magnetic field.

6) Absence of Assembly Cover

The absence of a blanker assembly cover reduces stray capacitance and, hence, voltage ringing. Also, the absence of a cover reduces the electric field that can be created along the beam axis by voltage ringing by moving the system ground surfaces farther away from the plates.

7) Reduction of $L_p$

A smaller axial plate length $L_p$ reduces the blip effect caused by dynamic electric field interaction.

The embodiments described above are illustrative only and not limiting. For example, all embodiments are optimized at 10 kV beam voltage operation. Extension to any other beam voltage is provided by the process detailed in Gesley 612. Those skilled in the art will recognize other embodiments within the scope of the present invention in light of the disclosure. The present invention is set forth in the following claims.

TABLE I

| FIG. 6 | DESCRIPTION | PART NO. |
|---|---|---|
| 601 | Blanker Flange | D612-6791-00 |
| 602 | Blanker Voltage Plate | D612-6793-00 |
| 603 | Support Channel | C612-6792-05 |
| 604 | Delay Line Spacer | A612-6794-00 |
| 605 | Screw 2-56 × 5/16 LG. BHMS NYLON | 000-2860-00 |
| 606 | Screw 4-40 × 1 V4 LG. SHCS SS1 | 000-2141-00 |
| 607 | Screw 6-32 × ½ LG. SHCS SST | 000-0325-00 |
| 608 | Connector, Bulkhead Feedthru | 120-3034-00 |
| 609 | Teflon Washer | A612-6515-00 |
| 610 | O-Ring 2-237 | 123-0135-00 |
| 611 | O-Ring 2-010 | 123-0013-00 |
| 612 | Nut & Lockwasher Supplied with Connector | N/A |
| 613 | Nut 4-40 SST | 000-0045-00 |
| 614 | Washer 4 SST | 000-0012-00 |

| FIGS. 7A-7H | DIMENSION IN INCHES (mm) |
|---|---|
| 7001 | 3.225 (81.915) |
| 7002 | 2.955 (75.057) |
| 7003 | 0.93 (23.622) |
| 7004 | 1.478 (37.5412) |
| 7005 | 0.32 (8.128) |
| 7006 | 0.16 (4.064) |
| 7007 | 0.135 (3.429) |
| 7008 | R |
| 7009 | 0.78 (19.812) |
| 7010 | 0.50 (12.7) |
| 7011 | 1.00 (25.4) |
| 7012 | 1.840 ± 0.001 (46.736 ± .0254) |
| 7013 | 0.549 ± 0.001 (13.9446 ± 0.254) |
| 7014 | 0.62 (15.748) |
| 7015 | 0.463 (11.7602) |
| 7016 | 0.177 (4.4958) |
| 7017 | 0.440 ± 0.001 (11.176 ± 0.254) |
| 7018 | 1.058 ± 0.001 (26.8732 ± .0254) |
| 7019 | 0.50 (12.7) |
| 7020 | 1.44 (36.576) |
| 7021 | 0.16 (4.064) |
| 7022 | 0.16R (4.064R) |
| 7023 | 0.12R (3.048R) |
| 7024 | 0.16 (4.064) |
| 7025 | 2.750 (69.85) |
| 7026 | 2.396 (60.858) |
| 7027 | 3.594 (91.288) |
| 7028 | 3.864 (98.146) |
| 7029 | 1.198 (30.429) |
| 7030 | 0.557 (14.148) |
| 7031 | 0.135 (3.429) |
| 7032 | 0.75 (19.05) |
| 7033 | 0.67 (17.018) |
| 7034 | 0.020 (0.508) |
| 7035 | 0.38 (9.652) |
| 7036 | 0.12 (3.048) |
| 7037 | 0.20 (5.08) |
| 7038 | 0.227 (5.766) |
| 7039 | 2.500 (63.5) |
| 7040 | 3.144 (79.858) |
| 7041 | 2.938 (74.625) |
| 7042 | 1.469 (37.313) |
| 7043 | 0.103 (2.616) |
| 7044 | $0.1258_{-.0000}^{+.0-003}$ ($3.195_{-.0000}^{+.00762}$) |
| 7045 | 0.135 (3.429) |
| 7046 | 0.156 (3.962) |
| 7047 | 0.745 (18.923) |
| 7048 | 0.156 (3.9624) |
| 7049 | 1.066 (27.0764) |
| 7050 | 0.20 (5.08) |
| 7051 | Vendor option for Dia. & Location |
| 7052 | 0.129 ± .002 (3.277 ± .508) |
| 7053 | 0.125 ± .001 (3.175 ± .0254) |
| 7054 | 0.15 (3.81) |
| 7055 | 0.075 (1.905) |
| 7056 | $0.1258_{-.0000}^{+.0-003}$ ($3.195_{-.0000}^{+.00762}$) |
| 7057 | $0.629_{-.0000}^{+.00-03}$ ($15.977_{-.0000}^{+.00762}$) |
| 7058 | 0.44 (11.176) |

TABLE I-continued

| | | |
|---|---|---|
| 7059 | $0.235_{-.0000}^{+.005}$ | ($5.969_{-.0000}^{+.127}$) |
| 7060 | $0.250_{-.0000}^{+.005}$ | ($6.35_{-.0000}^{+.127}$) |
| 7061 | $0.1245_{-.0000}^{+.0-002}$ | ($3.162_{-.0000}^{+.00508}$) |

| FIGS. 8A-8F | DIMENSIONS IN INCHES (mm) |
|---|---|
| 8001 | 3.405 (86.487) |
| 8002 | 6.693 ± 0.002 (170.002 ± .0508) |
| 8003 | 7.613 (193.370) |
| 8004 | 1.840 ± .002 (46.736 ± .0508) |
| 8005 | 0.102 (2.591) |
| 8006 | 0.203 (5.156) |
| 8007 | 0.212 (5.385) |
| 8008 | 0.178 ± .002 (4.521 ± .0508) |
| 8009 | 0.067 (1.702) |
| 8010 | 0.134 (3.404) |
| 8011 | 0.020 (0.508) |
| 8012 | $0.205_{-.0000}^{+.00-05}$ ($5.207_{-.0000}^{+.0127}$) |
| 8013 | 0.020 (0.508) |
| 8014 | 0.040 (1.016) |
| 8015 | 0.034 (0.864) |
| 8016 | 0.010 (0.254) |
| 8017 | 0.137 ± .002 (3.480 ± 0.508) |

| FIGS. 9A-9C | DIMENSIONS IN INCHES (mm) |
|---|---|
| 9001 | 0.250 (6.35) |
| 9002 | 0.156 (3.9624) |
| 9003 | 0.120 (3.048) |
| 9004 | 0.50 (12.7) |
| 9005 | 3.00 (76.2) |
| 9006 | 1.00 (25.4) |
| 9007 | 0.28 (7.112) |
| 9008 | 0.14 (3.556) |
| 9009 | 0.16 (4.064) |
| 9010 | 0.32 (8.128) |
| 9011 | 0.094 (2.387) |
| 9012 | 0.090 (2.286) |
| 9013 | 0.50 (12.7) |
| 9014 | 7.708 (195.783) |
| 9015 | 7.908 (200.863) |
| 9016 | $0.1260_{-.0000}^{+.0-005}$ ($3.200_{-.0000}^{+.0127}$) |
| 9017 | 0.281 (7.137) |
| 9018 | 0.25 (6.35) |
| 9019 | .023 ± .002 (5.156 ± .0508) |
| 9020 | 0.190 (4.826) |
| 9021 | 0.380 (9.652) |

I claim:

1. A method of minimizing beam jitter in a double deflection beam blanker having a first plate and a second plate comprising the steps of:
   coupling said first and said second plates;
   providing a first voltage source to said first plate, thereby creating a first current flow in said first plate; and
   providing a second voltage source to said second plate, thereby creating a second current flow in said second plate, wherein said first and second currents are antiparallel.

2. The method of claim 1 wherein said first and said second plates are differentially driven; said first voltage source being at any time a negative value of said second voltage source.

3. The method of claim 2 further including the step of:
   coupling said first and said second plates to a conductive flange.

4. The method of claim 3 wherein said conductive flange supports said first and said second plates.

5. The method of claim 1 wherein said first and said second plates are shaped symmetrically.

6. The method of claim 1 further including the step of not providing a cover for said blanker.

7. A double deflection beam blanker comprising:
a first plate;
a second plate coupled to said first plate;
a first voltage source providing a first current to said first plate;
a second voltage source providing a second current to said second plate, wherein said first and said second currents are antiparallel.

8. The blanker of claim 7, wherein said first and said second plates are differentially driven to opposite voltages.

9. The blanker of claim 7, wherein said first and second plates are coupled to a conductive flange.

10. The blanker of claim 9, wherein said conductive flange supports said first and said second plates.

11. The blanker of claim 7, wherein said first and said second plates are shaped symmetrically.

12. The blanker of claim 7, wherein said blanker is not covered.

13. The blanker of claim 7, wherein said second voltage source is at ground potential.

14. A blanker structure as in claim 7, further comprising a first and a second channel support fixed on said blanker flange for supporting respectively said first and second plates.

15. A blanker structure as in claim 14, further comprising a member for fixing a spacing between said first and second channel supports;
a first adjusting member for adjusting a spacing between said first channel support and said first plate; and
a second adjusting member for adjusting a spacing between said second channel support and said second plate.

16. A method of minimizing beam jitter in a double deflection beam blanker having a first plate and a second plate, comprising the steps of:
coupling said first and said second plates;
providing a first voltage source to said first plate, thereby creating a first current flow in said first plate;
providing a second voltage source to said second plate, thereby creating a second current flow in said second plate, wherein said first and said second plates are differentially driven; and
coupling said first and said second plates to a conductive flange.

17. A method of minimizing beam jitter in a double deflection beam blanker having a first plate and a second plate, comprising the steps of:
coupling said first and said second plates;
providing a first voltage source to said first plate, thereby creating a first current flow in said first plate;
providing a second voltage source to said second plate, thereby creating a second current flow in said second plate; and
not providing a cover for said blanker; wherein said first and second currents are antiparallel.

18. A double deflection beam blanker comprising:
a first plate;
a second plate coupled to said first plate;
a differential driver electrically connected to said first plate and to said second plate, wherein the differential driver drives said first plate to a first voltage and said second plate to a second voltage at any particular time, the second voltage being a negative of the first voltage.

19. A blanker structure for use in an electron beam column comprising:
a first plate configured as a delay line and having first and second terminals;

20. A blanker structure as in claim 19, wherein said second terminals of said first and second plates are grounded to said blanker flange.

21. A blanker structure as in claim 19, wherein said first and second plates are each of a U shape.

22. A blanker structure as in claim 19, wherein a minimum space is arranged between said two pairs of holes such that said connectors avoid physical contact with one another when fixed in said blanker flange.

23. A blanker structure as in claim 19, wherein said blanker flange is fixed to said electron beam column and provides a part of a vacuum boundary for said electron beam column.

24. A blanker structure as in claim 19, further comprising a differential driver connected to said first and second plates, whereby antiparallel currents flow through said first and second plates.

* * * * *

UNITED STATES PATENT AND TRADEMARK OFFICE
CERTIFICATE OF CORRECTION

PATENT NO. : 5,412,218

DATED : May 2, 1995

INVENTOR(S) : Mark A. Gesley et al

It is certified that error appears in the above-identified patent and that said Letters Patent is hereby corrected as shown below:

Column 3, line 9, delete "Drawings" and insert --Invention--;

Column 5, line 52, delete "of the";

Column 5, line 53, delete "aperture 340 diameter" and substitute --diameter of aperture 340--;

UNITED STATES PATENT AND TRADEMARK OFFICE
CERTIFICATE OF CORRECTION

PATENT NO. : 5,412,218
DATED : May 2, 1995
INVENTOR(S) : Mark A. Gesley et al.

It is certified that error appears in the above-identified patent and that said Letters Patent is hereby corrected as shown below:

Column 7, line 44, delete "220-2 and 220-4" and substitute --220'-2 and 220'-4--;

(Allowed Claim 17) - Column 12, line 27, insert:

--a second plate configured as a delay line and coupled to said first plate; and a conductive blanker flange connected to a circuit ground, and having two pairs of holes, wherein said first and second terminals of each of said first and second plates are mounted on said blanker flange through four connectors fixed in said two pairs of holes such that said first and second plates extend substantially perpendicularly to said blanker range.--

Signed and Sealed this

Fifteenth Day of August, 2000

Attest:

Q. TODD DICKINSON

Attesting Officer

Director of Patents and Trademarks